United States Patent [19]
Brick et al.

[11] 4,156,182
[45] May 22, 1979

[54] LIGHTNING STRIKE DETECTOR

[75] Inventors: Rowan O. Brick, Bellevue; Charles H. King, Kent, both of Wash.

[73] Assignee: The Boeing Company, Seattle, Wash.

[21] Appl. No.: 896,657

[22] Filed: Apr. 17, 1978

Related U.S. Application Data

[63] Continuation of Ser. No. 722,966, Sep. 13, 1976, abandoned.

[51] Int. Cl.² ............................................. G01R 31/02
[52] U.S. Cl. ...................................... 324/72; 361/117
[58] Field of Search .................... 324/76 A, 133, 102, 324/51; 340/248 R, 248 P, 27 R; 361/117

[56] References Cited

U.S. PATENT DOCUMENTS

| | | |
|---|---|---|
| 3,889,185 | 6/1975 | Wojtasinski ............................ 324/72 |
| 3,953,793 | 4/1976 | Nilsson ............................... 324/76 A |
| 4,005,357 | 1/1977 | Parkinson ............................ 324/72 |

Primary Examiner—M. Tokar
Attorney, Agent, or Firm—Lynn H. Hess; B. A. Donahue

[57] ABSTRACT

An apparatus is provided for the detection and counting of the number of lightning discharges on the skin of an aircraft. The apparatus comprises a sensor electrode for the detection of such discharge, an electronic circuit for generating and shaping a pulse at each detection interval, and a circuit for counting and displaying such pulses.

6 Claims, 3 Drawing Figures

LIGHTNING STRIKE DETECTOR

This is a continuation, of application Ser. No. 722,966, filed Sept. 13, 1976, and now abandoned.

BACKGROUND OF THE INVENTION

1. Field of the Invention

The present invention relates to an instrument for detecting and recording the number of lightning discharges on the skin of an aircraft.

2. Discussion of the Prior Art

As less metal and more plastic bonding techniques are used in the construction of aircraft, it becomes more important to understand the effects of lightning discharges on the skin of aircraft. Part of the basis for such an understanding is the accumulation of in-flight lightning strike data, since a knowledge of the actual probability of lightning strikes is essential to a determination of the extent and type of protection required.

The acquisition of such in-flight lightning strike data requires a detector which provides this basic data. Such a detector, to be practical should be as simple as possible with no required moving parts or apertures in the skin of the aircraft. In addition, such a detector should not require extensive wiring or burden already complex aircraft electrical systems. The present invention provides a solution to these requirements. Its extreme simplicity offers advantages over those inventions shown in the prior art.

Prior known aircraft lightning discharge detection systems typically require a rotating disc mounted flush in the aircraft's outer skin. The present invention is distinguishable over these types in that the detector has no moving parts nor does it require rotational movement with respect to the aircraft skin. Additionally, the present invention differs from those as typified in U.S. Pat. No. 1,893,337 by F. G. Patterson in that it utilizes ground as a reference eliminating the use of dual plates to overcome drift problems associated with aging.

DESCRIPTION OF THE PREFERRED EMBODIMENT

In general, the preferred embodiment comprises a sensor electrode for detecting sudden changes in potential due to the occurrence of lightning strikes, a means for generating and shaping a pulse indicative of said occurrences, a means for counting such lightning strike events, and finally, a means for displaying the number of lightning strike events per unit period of time.

Figure 1:
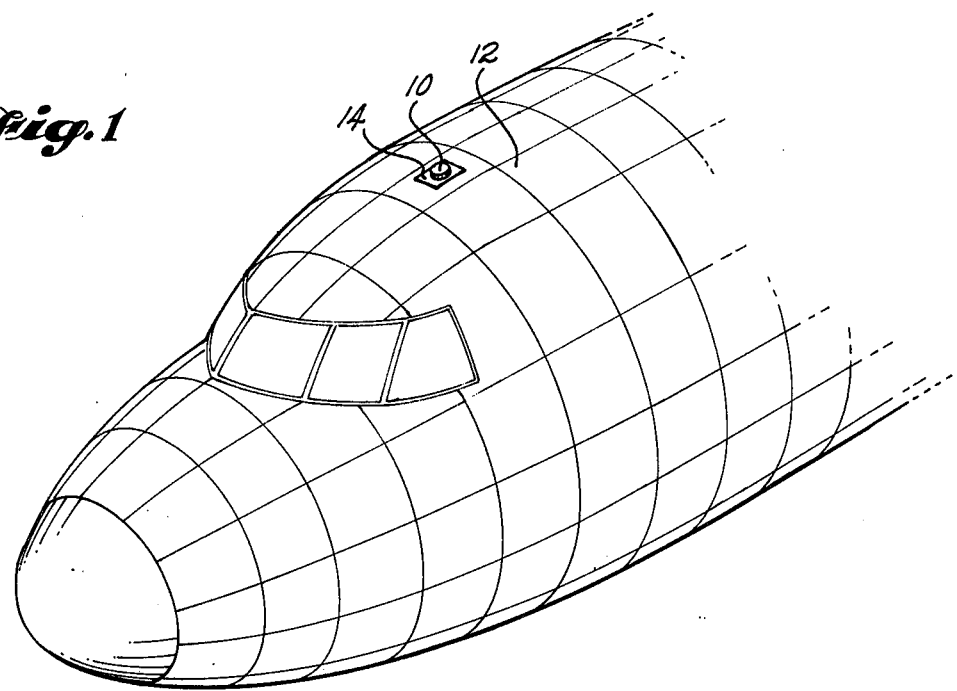
FIG. 1 is a portion of an aircraft fuselage showing a typical location of the present invention.

With reference to FIG. 1, sensor electrode 10 is shown as a single plate-like structure mounted on the aircraft fuselage and from aircraft skin 12 by a non-conductive material 14. Although sensor electrode 10 is shown in the preferred embodiment as a plate, alternate forms including a bolt or rivet head, or a portion of aircraft skin 12 may be used to practice the invention. The form of electrode 10 is not considered important; however, the size of electrode 10 effects the sensitivity of the electrode to the detection of lightning strikes on skin 12. The larger the cross-sectional area of electrode 10, the more sensitive it becomes to sudden changes in the potential of aircraft skin 12. Conversely, the smaller the cross-sectional area of electrode 10, the less sensitive it becomes to the potential changes encountered on skin 12 when struck by lightning.

Figure 2:
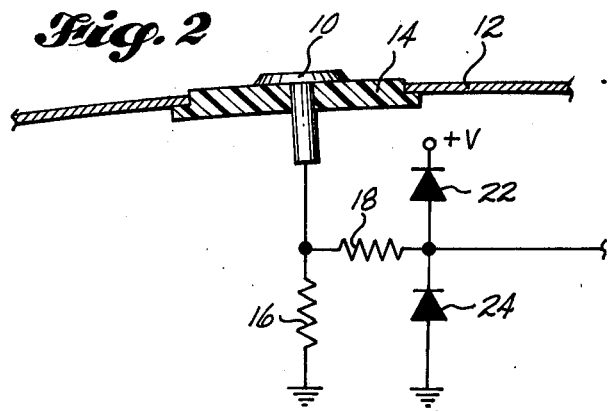
FIG. 2 is a cross-sectional view of the sensor electrode of the present invention.

With reference to FIG. 2, electrode 10 is isolated from the ground reference by resistor 16. The ohmic value of resistor 16 is such that the resulting time constant formed by resistor 16 and the stray capacitance of electrode 10 is faster than potential changes in electrode 10 due to electrostatic charging caused a lightning discharge.

A resistor divider network comprising resistors 18 and 20, and a diode clamping network comprising diodes 22 and 24 shape and limit any pulse generated as a result of any sudden change in the potential of electrode 10. Diodes 22 and 24 are back-biased to prevent any voltage excursions beyond a nominal voltage range.

Figure 3:
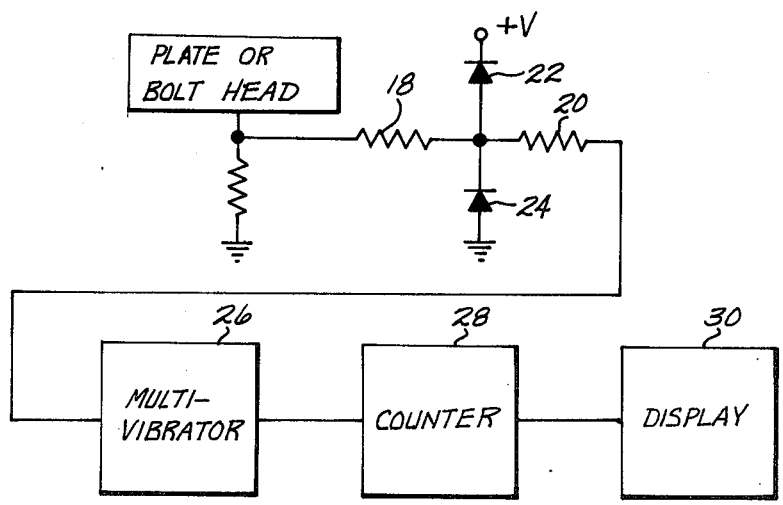
FIG. 3 is a block diagram of a preferred embodiment.

The output of the diode clamping network is applied through resistor 20 (FIG. 3) to the input of a pulse generating circuit. In the preferred embodiment, this is shown as a typical, integrated circuit astable multivibrator 26. However, any hybrid circuitry, including discrete component devices which provide a constant amplitude, constant time duration pulse can be used to practice the invention.

The output of astable multivibrator 26 is a constant amplitude, constant time duration pulse and occurs each time lightning strikes the aircraft skin 12. Each pulse is counted by a counting network 28 and displayed by device 30. Counting network 28 is shown in the preferred embodiment as an integrated circuit decade counter; however, any hybrid circuit or combination hybrid and discrete component circuitry can be utilized to practice the invention.

Once a lightning strike has been detected and counted, the resulting count is displayed by device 30. In the preferred embodiment, display device 30 is a solid state, light emitting diode integrated circuit. Although shown as an integrated circuit, any combination of hybrid and discrete component or hybrid circuitry can be used to display the resulting counts.

The operation of the present invention will be aided by following a sequence of events as aircraft skin 12 is struck by a lightning discharge. When this happens, the charge or potential on skin 12 of the structure surrounding sensor electrode 10 rapidly changes. Sensor electrode 10, although electrically isolated from skin 12, attempts to change its potential to equal that of the surrounding skin 12. As this happens, the charge on electrode 10 changes by inducing a current pulse across resistor 16 which isolates the electrode from the ground reference. The current pulse remains across resistor 16 until electrode 10 has discharged as determined by the time constant of resistor 16 and the stray capacitance of electrode 10. The current pulse produces a voltage across resistor 18 which is shaped and clamped by diodes 22 and 24. If the voltage pulse has positive potential variations greater than the nominal plus voltage, diode 22 becomes forward biased causing the maximum plus potential of the pulse to be clamped to such a valve. If the voltage pulse has negative potential variations, diode 24 becomes forward biased, clamping such variations to the ground reference.

The clamped voltage pulse is then applied through resistor 20 to the input of astable multivibrator 26. Multivibrator 26 produces an output voltage pulse of fixed voltage amplitude and fixed time duration for each input pulse independent of the time duration for each input pulse.

The multivibrator output is applied to the input of counter network 28 where such pulse updates any previous count contained within this counter. The output of the counting network, typically in a binary coded decimal form, is displayed by network 30.

Accordingly, the foregoing disclosure and description is for illustrative purposes only and does not in any way limit the invention which is defined only by the following claims.

What is claimed is:

1. In an aircraft, an apparatus for detecting and counting only lightning discharges striking the aircraft, said apparatus comprising:
    a sensor electrode mounted to the outside of said aircraft;
    a non-conductive material disposed between said sensor electrode and an outside portion of said aircraft for electrically isolating said sensor electrode from said outside portion of said aircraft;
    a first electrical resistance connected between said sensor electrode and a ground reference on said aircraft;
    pulse generating means for generating a single pulse of constant amplitude and fixed duration in response to each lightning discharge striking said outside of said aircraft, said pulse generating means including a diode clamping network, a second electrical resistance connected between said sensor electrode and said diode clamping network, a multivibrator, and a third electrical resistance connected between said diode clamping network and said multivibrator; and
    a counter connected to the multivibrator for continuously recording the sum of said single pulses during a selected time period.

2. In an aircraft, apparatus for detecting and recording a count of lightning discharges striking any part of an outside skin of said aircraft, said apparatus comprising:
    a sensor electrode mounted on an outside portion of said aircraft and capacitively coupled to said skin;
    means connected to said sensor electrode for generating a single pulse in response to a sudden change in the electrical potential on said skin caused by each said lightning discharge striking said skin; and
    means responsive to each said pulse for recording each said lightning discharge.

3. In an aircraft, apparatus for detecting and displaying a count of only those lightning discharges which strike an outside portion of said aircraft, said apparatus comprising:
    a sensor electrode mounted on said outside portion of said aircraft and capacitively coupled to said outside portion;
    an electrical resistance connecting said sensor electrode to a ground reference;
    a pulse generator electrically connected to said sensor electrode and responsive to a sudden change in the voltage differential between said sensor electrode and said outside portion of said aircraft to generate a single pulse as a consequence of each lightning discharge striking said outside portion of said aircraft; and
    a counter electrically connected to said pulse generator for accumulating a count of the pulses generated by said pulse generator.

4. In an aircraft as claimed in claim 3 including a display electrically connected to said counter for visually displaying the count accumulated by said counter.

5. In an aircraft as claimed in claim 3 including a resistor divider network electrically connected between said sensor electrode and said pulse generator.

6. In an aircraft as claimed in claim 3 including a diode clamping network electrically connected between said sensor electrode and said pulse generator.

* * * * *